United States Patent
Mashiko

[19]

[11] Patent Number: 5,949,233
[45] Date of Patent: Sep. 7, 1999

[54] CIRCUIT FOR DETECTING OVERCHARGING AND OVERDISCHARGING

[75] Inventor: Takeshi Mashiko, Chiba, Japan

[73] Assignee: Seiko Instruments Inc., Japan

[21] Appl. No.: 08/862,626

[22] Filed: May 23, 1997

[30] Foreign Application Priority Data

May 24, 1996 [JP] Japan .................................. 8-130383

[51] Int. Cl.$^6$ ..................... G01N 27/416; G01R 31/36; H01M 10/44
[52] U.S. Cl. ..................... 324/433; 324/434; 320/134; 320/136; 320/161
[58] Field of Search .................................. 324/426, 433, 324/434; 320/116, 118, 119, 128, 134, 135, 136, 161

[56] References Cited

U.S. PATENT DOCUMENTS 5,530,336  6/1996  Eguchi et al. ............................... 320/5

*Primary Examiner*—Glenn W. Brown
*Attorney, Agent, or Firm*—Adams & Wilks

[57] ABSTRACT

Instability and oscillation are avoided in an overcharge/overdischarge control circuit by providing comparators with sufficient gain to minimize leakage current penetration into control circuitry when an output of a comparator used for comparing the output voltage of a secondary cell with a reference voltage is at an intermediate level. An overcharging/overdischarging detection circuit with two secondary cells connected in series has voltage dividing resistors connected in parallel therewith for producing a divided output voltage for each secondary cell, the divided output voltages each being supplied to a respective comparator. A first comparator has an input stage comprising N-channel MOS devices. A second comparator has an input stage comprising P-channel MOS devices. The comparator outputs have a first value when the secondary cell is not in one of an overcharged and an overdischarged state, a second value when the secondary cell is in one of an overcharged and an overdischarged state, and an intermediate value when the secondary cell is between a normal state and one of an overcharged and an overdischarged state. The large gains of the comparators prevent the intermediate value from causing undesired current penetration and the instability associated therewith.

12 Claims, 2 Drawing Sheets

CIRCUIT FOR DETECTING OVERCHARGING AND OVERDISCHARGING

BACKGROUND OF THE INVENTION

The present invention relates to a circuit capable of controlling charging and discharging of a secondary battery and to a charging power supply using that circuit.

A circuit for detecting overcharging and overdischarging is known, as shown in the circuit block diagram of FIG. 2. In particular, two secondary cells 201 and 202 are connected in series. Voltage-dividing resistors 203, 204 and 205, 206 are connected with the secondary cells, respectively, to produce divided voltages of the cell voltages. Reference voltage circuits 207 and 208 produce certain voltages. Voltage comparator circuits 209 and 210 compare the outputs from the voltage division circuits with the outputs from the reference voltage circuits in magnitude and switch their output signals. The output signals from the voltage comparator circuits are changed by a control circuit 211 into signals that control overcharging and overdischarging of the cells. Notice that no limitations are placed on the number of overcharging/ overdischarging detection circuits per secondary cell.

For example, during detection of overcharging, the ratio of the voltage-dividing resistors 203 and 204 and the ratio of the voltage-dividing resistors 205 and 206 are so adjusted that the detected voltages indicate overcharging of the secondary cells. When the secondary cell 201 reaches its overcharged voltage, the output from the voltage comparator circuit 209 changes from low to high state. When the secondary cell 202 reaches its overdischarged voltage, the output from the voltage comparator circuit 210 varies from low to high level. The control circuit 211 performs a logical operation on the outputs from the voltage comparator circuits 209 and 210 and produces control signals to protect the two secondary cells 201 and 202.

The resistors 212, 213, and 214 act to protect the overcharging/overdischarging detection circuit from the secondary cells.

With the prior art overcharging/overdischarging detection circuit, the secondary cell 201 or 202 gives a voltage detected. When the output signal from the voltage comparator circuit 209 or 210 is switched, a P-channel MOSFET 221 or 223 and an N-channel MOSFET 222 or 224 that are connected in series are momentarily turned on. These MOSFETs are included in a logic circuit incorporated in the control circuit 211, and are inverters, for example. As a result, a current ic penetrates through the inverters. This current easily flows, because the secondary cells vary at a very low rate, prolonging the time for which the P- and N-channel MOSFETs of the inverters are in an ON state. Depending on the driving ability of the MOSFETs, very large currents on the order of several milliamperes may flow. This penetrating current flows through the protective resistors 212 and 214 of hundreds of ohms. These protective resistors are inserted between the secondary cells 201 and 202 and the overcharging/overdischarging detection circuits. The resultant voltages vary the detected voltages or cause the overcharging/overdischarging detection circuits to malfunction.

SUMMARY OF THE INVENTION

In order to solve the foregoing problems, this invention modifies the configuration of the comparators without increasing the current consumed by the overcharging/overdischarging detection circuits, thus varying the operating points to obtain sufficient gains. In this way, the current penetrated through the control circuit is suppressed.

Specifically, an overcharging/overdischarging detection circuit in accordance with the present invention comprises two secondary cells connected in series and producing cell voltages, first and second voltage division circuits each connected with a respective one of the secondary cells, respectively, and producing voltages that are submultiples of the cell voltages (divided voltages of the cell voltages), first and second reference voltage circuits for producing constant voltages, first an second voltage comparator circuits eacg for comparing the magnitude of a respective one of the outputs from voltage division circuits with an output of a respective one of the reference voltage circuits and for switching their output signals depending upon the comparison result and a control circuit for producing signals to control charging or discharging of said secondary cells. Where the positive voltage terminals of the secondary cells and the highest one of a reference voltage of a negative voltage output type and the voltages from the voltage comparator circuits are made common, the voltage comparator circuits are differential comparators of an N-channel MOS input type. Where the negative voltage terminals of the secondary cells and a terminal impressed with the lowest one of the reference voltage of a positive voltage output type and the voltages from the voltage comparator circuits are made common, the voltage comparator circuits are differential comparators of a P-channel MOS input type.

The above-described voltage division circuits, reference voltage circuits, and voltage comparator circuits are arranged in pairs for detection of overcharging and detection of overdischarging, respectively. Thus, a circuit that detects overcharging and overdischarging is provided.

A charging power supply in accordance with the present invention is composed of the overcharging/overdischarging detection circuit of the above-described construction, secondary cells, and a charger.

DETAILED DESCRIPTION OF THE PREFERRED EMBODIMENTS

Embodiments of the present invention are hereinafter described with reference to the attached drawings.

Figure 1:
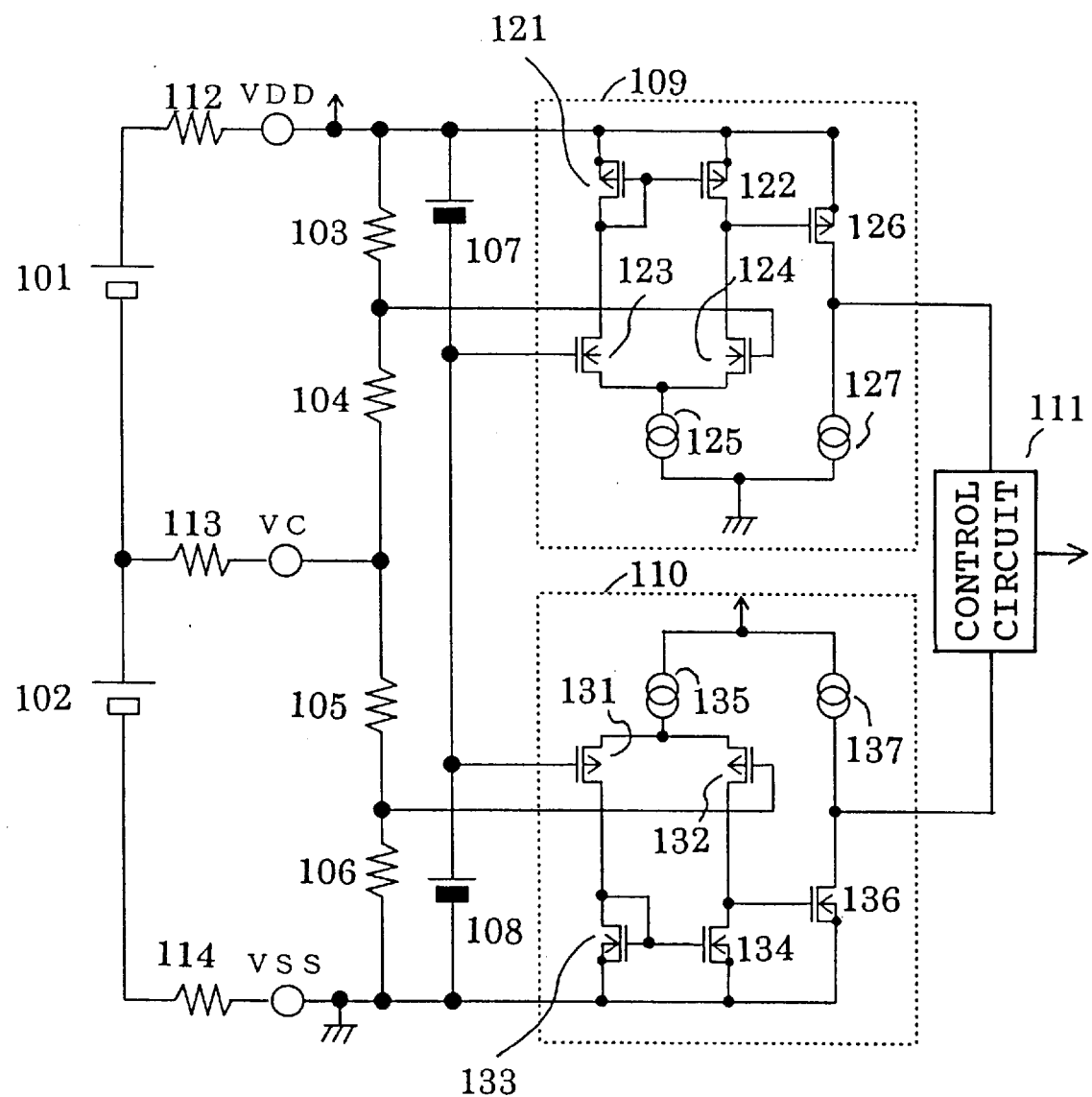
FIG. 1 is a circuit block diagram of a power supply using an overcharging/overdischarging detection circuit in accordance with the present invention.
Figure 2:
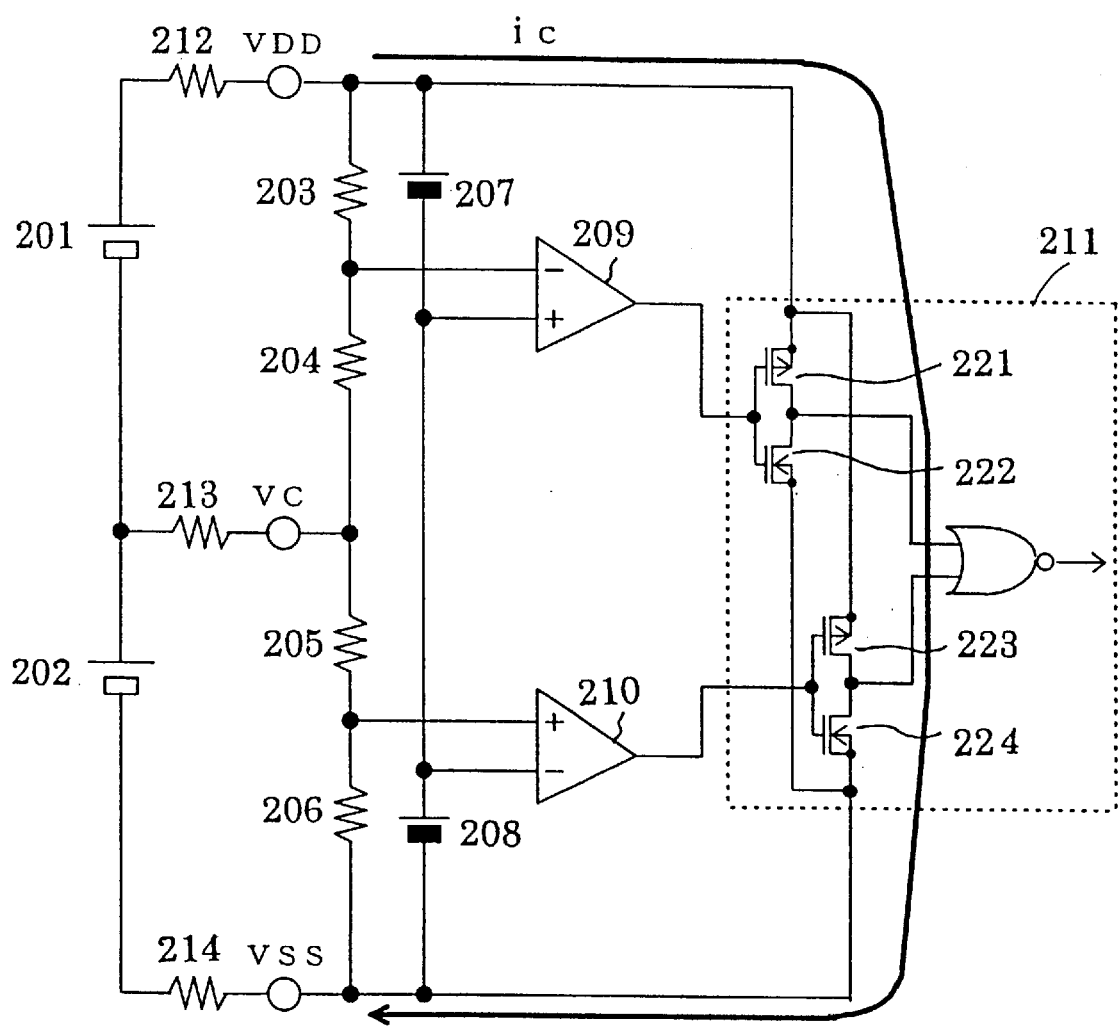
FIG. 2 is a circuit block diagram of a power supply using the prior art overcharging/overdischarging detection circuit.

FIG. 1 is a block diagram of a charging power supply using an overcharging/overdischarging detection circuit in accordance with the invention. The structure of this detection circuit is described below.

Two secondary cells 101 and 102 are connected in series. The positive side of the cell 101 is connected with a VDD terminal via a protective resistor 112. The junction of the cells 101 and 102 is connected with a VC terminal via a protective resistor 113. The negative side of the cell 102 is connected with a VSS terminal via a protective terminal 114. A reference voltage source 107 for producing a given voltage is connected between the VDD terminal and the VSS terminal such that the VDD terminal serves as a common terminal. Also, a reference voltage source 108 for generating a certain voltage is connected between the VDD terminal and the VSS terminal such that the VSS terminal acts as a common terminal. Voltage-dividing resistors 103 and 104 using the VDD terminal as their common terminal are connected between the VDD terminal and the VC terminal to divide the cell voltage. Also, voltage-dividing resistors 105 and 106 using the VSS terminal as their common terminal are connected between the VC terminal and the VSS terminal to divide the cell voltage.

The circuitry comprises voltage comparator circuits 109 and 110. The output from one voltage division circuit is applied to the junction of the resistors 103 and 104 and also to the voltage comparator circuit 109, which also receives the output from the reference voltage source 107, compares it with the voltage appearing at the VDD terminal, and produces an output signal. The output from the other voltage division circuit appears at the junction of the resistors 105 and 106 and is applied to the voltage comparator circuit 110. This voltage comparator circuit 110 compares this input signal with the output from the reference voltage source 108 and produces an output signal.

The output signals from the voltage comparator circuits 109 and 110 are changed by a control circuit 111 into signals to control charging and discharging of the cells. It is to be noted that no limitations are imposed on the number of overcharging/overdischarging detection circuits per secondary cell.

Taking detection of overcharging as an example, the operation of the novel overcharging/overdischarging circuit is next described.

The ratio between the dividing resistors 103 and 104 and the ratio between the dividing resistors 105 and 106 are so set that maximum voltages across the secondary cells 101 and 102 without overcharging are provided as outputs of the voltage division circuits.

When the cell voltages across the two secondary cells 101 and 102 indicate that they are not overcharged, the absolute value of the voltage appearing at the junction of the resistors 103 and 104 that is a fraction or submultiple of the voltage across the secondary cell 101 is smaller than the absolute value of the voltage from the reference voltage source 107. At this time, the VDD terminal is a common terminal. The output from the voltage comparator circuit 109 is low. With respect to the secondary cell 102, the absolute value of the voltage at the junction of the resistors 105 and 106 that is a fraction or submultiple of the voltage across the cell is smaller than the absolute value of the output from the reference voltage source 108. At this time, the VSS terminal acts as a common terminal. Therefore, the output from the voltage comparator circuit 110 is also low.

Then, a charger is connected, so that the voltages across the two secondary cells 101 and 102 connected in series increase gradually. When any one secondary cell reaches its overcharged voltage, the absolute value of the divided voltage from any cell (at the junction of the resistors 103 and 104 or the junction of the resistors 105 and 106) is greater than the absolute value of the voltage from the reference voltage source (107 or 108). The output from any one voltage comparator (109 or 110) changes from low to high state. This signal is changed into a signal for controlling the charging of the cell by the control circuit 111. In consequence, the charging is controlled.

The problem solved by the overcharging/overdischarging detection circuit in accordance with the invention is next described.

Whenever the output from the voltage comparator circuit 109 or 110 makes a transition from a low state to a high state, the circuit passes through a mid potential. This induces a penetrating current in the CMOS logic devices used in the control circuit 111. This penetrating current flows through the protective resistors 112 and 114, resulting in a voltage drop (penetrating current protective resistance). The voltage between the terminals VDD and VC or between the terminals VC and VSS becomes smaller than the actual voltage of the secondary cell 101 or 102. Consequently, the detected voltage rises or the overcharging/overdischarging detection circuit oscillates. That is, the overcharging/overdischarging circuit malfunctions.

During charging of the secondary cells 101 and 102, the voltages rise slowly. Therefore, if the voltage ranges of the secondary cells at which the outputs from the voltage comparator circuits assume intermediate potentials are wide, the penetrating current flows for a prolonged time. As a result, the overcharging/overdischarging detection circuit easily malfunctions. Let VDD be the voltage developed between the terminals VDD and VSS. Let VDET be the voltage of the secondary cell detected. Let Vref be the absolute value of the voltage of the reference voltage source output. Let G be the gain of the voltage comparator circuit for input and output voltages. The voltage range Vin of the secondary cell at which the voltage comparator circuit assumes intermediate potentials is given by Eq. (1). [0017]

$$\Delta \text{Vin} = (\text{VDD}/G) \times (\text{VDET}/\text{Vref}) \qquad (1)$$

Accordingly, the voltage range in of the secondary cell can be narrowed by increasing the gain of the voltage comparator circuit for input and output voltages.

The overcharging/overdischarging detection circuit in accordance with the present invention increases the gain for input and output voltages without increasing the area of the devices of the voltage comparator circuit or the electric power consumption. Therefore, the voltage comparator circuit can be constructed as follows.

First, the voltage comparator circuit 109 on the side of the cell 101 is composed of a differential comparator whose input stage consists of N-channel MOS devices. As shown in FIG. 1, the circuit comprises P-channel MOS transistors 121, 122, 126, N-channel MOS transistors 123, 124, and constant-current sources 125, 127. The voltage comparator circuit 110 on the side of the cell 102 is a differential comparator whose input stage consists of P-channel MOS devices. As shown in FIG. 1, this circuit comprises P-channel MOS transistors 131, 132, N-channel MOS transistors 133, 134, 136, and constant-current sources 135, 137.

It is known that a differential comparator generally cannot provide a gain if it is operated very close to its in-phase input limit. On the side of the secondary cell 101, the input voltage to the voltage comparator circuit is high because the VDD terminal is a common terminal. On the side of the secondary cell 102, the input voltage to the voltage comparator circuit is low because the VSS terminal is a common terminal. Therefore, the configuration including the secondary cell 101 employs a differential comparator whose input stage is composed of N-channel MOS devices. It is known that this kind of differential comparator is adapted to increase the in-phase input range. The configuration including the secondary cell 102 makes use of a differential comparator whose input stage is composed of P-channel MOS devices. It is known that this type of comparator is adapted to reduce the in-phase input range.

As thus far described, in the overcharging/overdischarging detection circuit in accordance with the present invention, where a reference voltage source of a negative voltage output type using the positive voltage terminal of a secondary cell as a common terminal is used, the voltage comparator circuit is a differential comparator whose input stage is composed of N-channel MOS devices. Where a reference voltage source of a positive voltage output type using the negative voltage terminal of a secondary cell as a common terminal is employed, the voltage comparator circuit is a differential comparator whose input stage is composed of P-channel MOS devices. Thus, operation very close to its in-phase input range is circumvented and an optimum gain is obtained. Consequently, penetrating currents flowing through the CMOS logic devices used in the control circuit 111 can be suppressed.

In the illustrative embodiment of the invention, an example of detection of overcharging has been shown. Obviously, overdischarging can be detected with similar concept and configuration. The present invention can be applied to circuitry for detecting overcharging and overdischarging by arranging the above-described voltage division circuits, reference voltage circuits, and voltage comparator circuits in pairs.

Of course, a reliable power supply source without malfunctioning can be provided, using the overcharging/overdischarging detection circuit in accordance with the invention, secondary cells, and a charger.

Because of the configuration described thus far, in the overcharging/overdischarging detection circuit in accordance with the present invention, if protective resistors are inserted between cells and the overcharging/overdischarging detection circuits, no side effects appear. That is, the voltages indicating overcharging and overdischarging do not vary. Also, the overcharging/overdischarging detection circuits are prevented from malfunctioning. As a result, precise detection of overcharging and overdischarging is possible.

What is claimed is:

1. A circuit for detecting overcharging and overdischarging comprising:

first and second secondary cells connected in series and each producing a cell voltage;

first and second voltage division circuits each connected in parallel with a respective secondary cell and each producing a divided voltage of a respective cell voltage;

first and second reference voltage circuits each for producing a reference voltage;

first and second voltage comparator circuits each for comparing an output from a respective voltage division circuit with a respective reference voltage and for producing an output signal depending upon the comparison result; and a control circuit for producing signals to control charging or discharging of the first and second secondary cells according to the output signals from the voltage comparator circuits;

wherein the first voltage comparator circuit comprises a differential comparator of N-channel MOS input type, the first voltage comparator circuit is connected to the first reference voltage circuit, the first reference voltage reference circuit produces a negative voltage output using the positive voltage terminal of the first secondary cell as a common terminal, the second voltage comparator circuit comprises a differential comparator of P-channel MOS input type, the second voltage comparator circuit is connected to the second reference voltage circuit, and the second reference voltage circuit produces a positive voltage output using the negative voltage terminal of the second secondary cell as a common terminal.

2. A chargeable power supply comprising the overcharging/overdischarging detection circuit of claim 1 and a charger.

3. A circuit for detecting an overcharged or an overdischarged state of a secondary cell, comprising: a comparator connectable when in use to a secondary cell for comparing a voltage produced by the secondary cell with a reference voltage to determine whether the secondary cell is in one of an overcharged and an overdischarged state and outputting an indicating signal based upon the comparison result, the indicating signal having a first value when the secondary cell is not in one of an overcharged and an overdischarged state, a second value when the secondary cell is in one of an overcharged and an overdischarged state, and an intermediate value when the secondary cell is between a normal state and one of an overcharged and an overdischarged state; and a control circuit for receiving the indicating signal and controlling the charging or discharging of the secondary cell in accordance with the indicating signal; wherein the comparator has a gain sufficient to prevent instability due to a current from the secondary cell penetrating into the control circuit when the indicating signal output from the comparator has an intermediate value.

4. A rechargeable electronic power supply comprising: a secondary cell; a charger for recharging the secondary cell; and the circuit for detecting an overcharged or a overdischarged state of the secondary cell according to claim 3.

5. A circuit according to claim 3; further comprising a voltage dividing circuit connected in parallel to the secondary cell when in use for producing a divided output voltage comprising a portion of the output voltage of the secondary cell, and wherein the divided output voltage is input to the comparator.

6. A circuit according to claim 5; further comprising a reference voltage circuit for producing the reference voltage which is input to the comparator so that the comparator compares the reference voltage with the divided output voltage of the secondary cell, wherein the reference voltage is set depending upon whether a detected state is an overcharged state or an overdischarged state of the secondary cell.

7. A circuit according to claim 6; wherein the comparator circuit comprises a differential comparator circuit having an input stage comprising N-channel MOS devices and the reference voltage circuit produces a negative output using a positive voltage terminal of the secondary cell as a common terminal.

8. A circuit according to claim 6; wherein the comparator circuit comprises a differential comparator circuit having an input stage comprising P-channel MOS devices and the reference voltage circuit produces a positive output using a negative voltage terminal of the secondary cell as a common terminal.

9. A circuit according to claim 3; wherein the secondary cell comprises first and second secondary cells connected in series when in use; and the comparator comprises first and second comparator circuits each for comparing a voltage produced by a respective secondary cell with the reference voltage to determine whether the first and second secondary cells are in one of an overcharged and an overdischarged state.

10. A circuit according to claim 9; further comprising first and second voltage dividing circuits each connected in parallel when in use to a respective one of the secondary cells, each for producing a divided output voltage comprising a portion of the output voltage of the respective secondary cell; and wherein the divided output voltage is input to a respective comparator circuit.

11. A circuit according to claim 10; further comprising first reference voltage circuit for producing a first reference voltage and a second reference voltage circuit for producing a second reference voltage, and wherein the first reference voltage is supplied to the first comparator circuit for comparison with a divided output voltage of the first voltage dividing circuit and the second reference voltage is supplied to the second comparator circuit for comparison with a divided output voltage of the second voltage dividing circuit to determine whether the respective secondary cells are in one of an overcharged and an overdischarged state.

12. A circuit according to claim 11; wherein the first comparator circuit comprises a differential comparator of N-channel MOS input type, the first comparator circuit is connected to the first reference voltage circuit, the first reference voltage circuit produces a negative voltage output using the positive voltage terminal of the first secondary cell as a common terminal, the second comparator circuit comprises a differential comparator of P-channel MOS input type, the second comparator circuit is connected to the second reference voltage circuit, and the second reference voltage circuit produces a positive voltage output using the negative voltage terminal of the second secondary cell as a common terminal.

* * * * *